(12) United States Patent
Kobayashi et al.

(10) Patent No.: US 9,608,150 B2
(45) Date of Patent: Mar. 28, 2017

(54) PHOTOELECTRIC CONVERTING APPARATUS

(75) Inventors: Hideo Kobayashi, Tokyo (JP); Tetsunobu Kochi, Hiratsuka (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 117 days.

(21) Appl. No.: 13/595,520

(22) Filed: Aug. 27, 2012

(65) Prior Publication Data

US 2013/0056807 A1   Mar. 7, 2013

(30) Foreign Application Priority Data

Sep. 5, 2011 (JP) ................................ 2011-193057

(51) Int. Cl.
*H01L 27/146* (2006.01)
*H01L 31/0352* (2006.01)
*H01L 31/103* (2006.01)

(52) U.S. Cl.
CPC .. *H01L 31/03529* (2013.01); *H01L 27/14647* (2013.01); *H01L 31/103* (2013.01); *Y02E 10/50* (2013.01)

(58) Field of Classification Search
CPC .................. H01L 27/14647; H01L 31/035263
See application file for complete search history.

(56) References Cited

U.S. PATENT DOCUMENTS

| | | | |
|---|---|---|---|
| 5,428,237 A | 6/1995 | Yuzurihara et al. | 257/349 |
| 5,835,045 A | 11/1998 | Ogawa et al. | 341/155 |
| 5,841,685 A | 11/1998 | Kochi | 364/807 |
| 5,847,669 A | 12/1998 | Kochi | 341/172 |
| 6,166,583 A | 12/2000 | Kochi et al. | 327/407 |
| 6,956,273 B2 | 10/2005 | Koizumi | 257/440 |
| 2003/0189237 A1 | 10/2003 | Koizumi | 257/461 |
| 2005/0087829 A1* | 4/2005 | Merrill et al. | 257/440 |
| 2007/0218580 A1* | 9/2007 | Hsu et al. | 438/48 |

FOREIGN PATENT DOCUMENTS

| | | |
|---|---|---|
| JP | 2001-326378 A | 11/2001 |
| JP | 2003-298102 | 10/2003 |
| JP | 2004-510355 A | 4/2004 |
| WO | WO 02/27804 A2 | 4/2002 |

* cited by examiner

*Primary Examiner* — Yu Chen
(74) *Attorney, Agent, or Firm* — Fitzpatrick, Cella, Harper & Scinto

(57) ABSTRACT

A photoelectric converting apparatus has first and third semiconductor layers of a first conductivity type which respectively output signals obtained by photoelectric conversion, and second and fourth semiconductor layers of a second conductivity type supplied with potentials from a potential supplying unit. In the photoelectric converting apparatus, the first, second, third and fourth semiconductor layers are arranged in sequence, the second and fourth semiconductor layers are electrically separated from each other, and the potential to be supplied to the second semiconductor layer and the potential to be supplied to the fourth semiconductor layer are controlled independently from each other.

19 Claims, 6 Drawing Sheets

PHOTOELECTRIC CONVERTING APPARATUS

BACKGROUND OF THE INVENTION

Field of the Invention

The present invention relates to a photoelectric converting apparatus.

Description of the Related Art

Japanese Patent Application Laid-Open No. 2004-510355 discloses a sensor in which three semiconductor layers of a first conductivity type and three semiconductor layers of a second conductivity type are alternately laminated. In the sensor disclosed in Japanese Patent Application Laid-Open No. 2004-510355, it is possible to obtain three color signals from one pixel by independently extracting a photoelectric current from each of the three semiconductor layers of the first conductivity type respectively having different depths from the surface.

Moreover, Japanese Patent Application Laid-Open No. 2001-326378 discloses that the width of a depletion layer is controlled by changing a reverse bias voltage of a PN junction photodiode. It is thus possible in Japanese Patent Application Laid-Open No. 2001-326378 to control sensitivity for the wavelength of light detected by a photosensor, i.e., a spectral characteristic.

SUMMARY OF THE INVENTION

A photoelectric converting apparatus, in accordance with an embodiment of the present invention, comprises: a first semiconductor layer of a first conductivity type, configured to output a first signal obtained by photoelectric conversion; a second semiconductor layer of a second conductivity type being opposite to the first conductivity type, configured to be supplied with a first potential from a potential supplying unit; a third semiconductor layer of the first conductivity type, configured to output a second signal obtained by the photoelectric conversion; and a fourth semiconductor layer of the second conductivity type, configured to be supplied with a second potential from the potential supplying unit. Moreover, in the photoelectric converting apparatus in accordance with the embodiment, the first semiconductor layer, the second semiconductor layer, the third semiconductor layer and the fourth semiconductor layer are arranged in sequence, the second semiconductor layer and the fourth semiconductor layer are electrically separated from each other, and the first potential to be supplied to the second semiconductor layer and the second potential to be supplied to the fourth semiconductor layer are configured to be controlled independently of each other.

Further features of the present invention will become apparent from the following description of exemplary embodiments with reference to the attached drawings.

DESCRIPTION OF THE EMBODIMENTS

Figure 1:
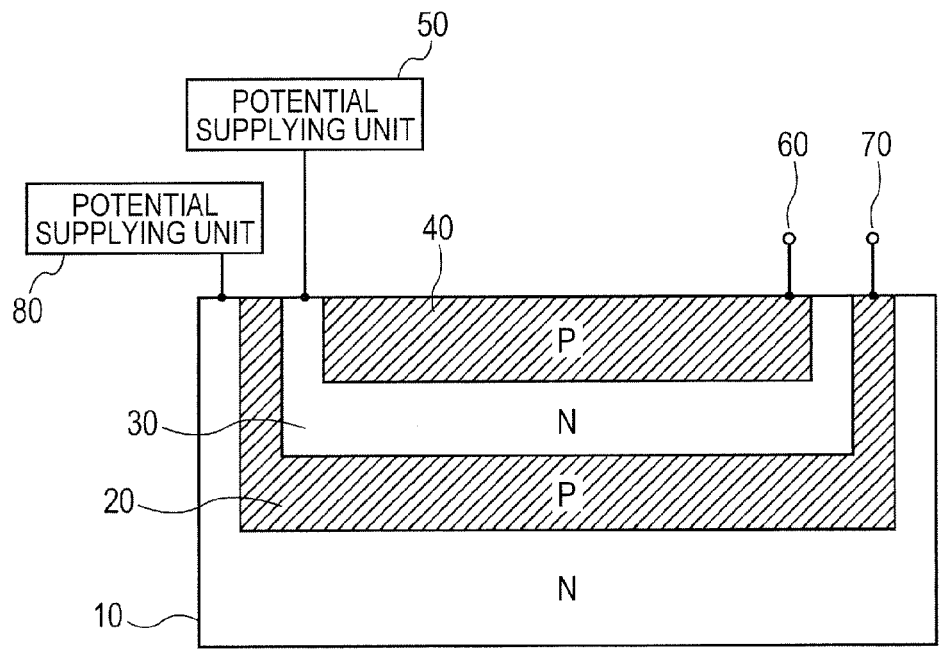
FIG. 1 is a cross-section diagram illustrating a structural example of a photoelectric converting apparatus according to a first embodiment of the present invention.

Embodiments of the present invention will now be described in detail in accordance with the accompanying drawings.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

First Embodiment

Hereinafter, the first embodiment of the present invention will be described. FIG. 1 is a cross-section diagram illustrating a structural example of a photoelectric converting apparatus according to the first embodiment. The photoelectric converting apparatus according to the first embodiment has a structure that a plurality of semiconductor layers of a first conductivity type and a plurality of semiconductor layers of a second conductivity type which is in inverse relation to the first conductivity type are alternately laminated in a semiconductor substrate. In the following description, it is assumed that the first conductivity type is a P type and the second conductivity type is an N type.

More specifically, a semiconductor layer 20 of the first conductivity type is formed on a lowermost semiconductor layer 10 of the second conductivity type, a semiconductor layer 30 of the second conductivity type is formed on the semiconductor layer 20 of the first conductivity type, and a semiconductor layer 40 of the first conductivity type is formed on the semiconductor layer 30 of the second conductivity type. That is, the semiconductor layer (first semiconductor layer) 40, the semiconductor layer (second semiconductor layer) 30, the semiconductor layer (third semiconductor layer) 20 and the semiconductor layer (fourth semiconductor layer) 10 are arranged in sequence. The semiconductor layer 30 of the second conductivity type and the semiconductor layer 10 of the second conductivity type are electrically separated from each other by the semiconductor layer 20 of the first conductivity type. For example, when the two semiconductor layers of the same conductivity type are completely separated from each other by the semiconductor layer of the inverse conductivity type, these two semiconductor layers are electrically separated from each other. Alternatively, when the potential of each of these two semiconductor layers can be controlled independently, it is thought that these two semiconductor layers are electrically separated from each other even if they are not completely separated from each other by the semiconductor layer of the inverse conductivity type.

A potential supplying unit 50 is connected to the semiconductor layer 30 of the second conductivity type, and a potential supplying unit 80 is connected to the semiconductor layer 10 of the second conductivity type. The potential supplying units 50 and 80 can independently set the potentials of the corresponding semiconductor layers 30 and 10 of the second conductivity type, respectively. Incidentally, in the present embodiment, it only has to be able to set the potential of the semiconductor layer 30 of the second conductivity type independently of the potential of the semiconductor layer 10 of the second conductivity type. For this reason, the potential supplying unit 80 for setting the potential of the semiconductor layer 10 of the second conductivity type may be omitted according to the circumstances.

Further, current output terminals 70 and 60 are respectively provided to the semiconductor layers 20 and 40 of the first conductivity type. Each of the semiconductor layers 20 and 40 of the first conductivity type forms a photodiode between each layer and each of the adjacent semiconductor layers of the second conductivity type, and each of the formed photodiodes has a depth suitable for performing photoelectric conversion to light of a different band of wavelength. A photoelectric current (second signal) obtained from the semiconductor layer 20 of the first conductivity type can be extracted from the current output terminal 70, and a photoelectric current (first signal) obtained from the semiconductor layer 40 of the first conductivity type can be extracted from the current output terminal 60.

Figure 2:
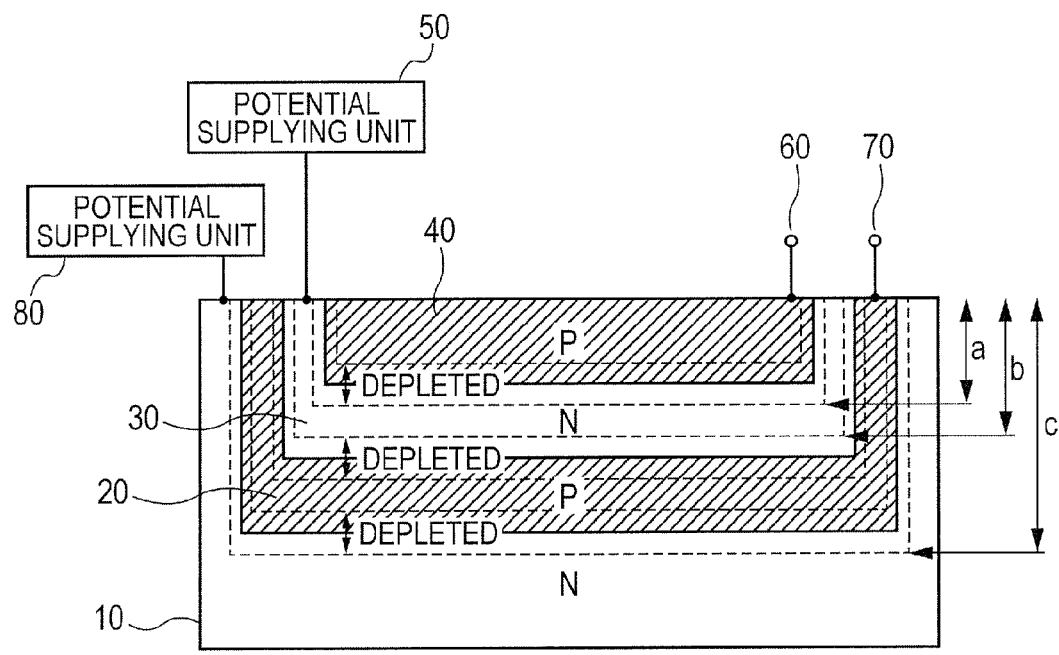
FIG. 2 is a diagram for describing the photoelectric converting apparatus according to the first embodiment of the present invention.

As illustrated in FIG. 2, each of the semiconductor layers 20 and 40 of the first conductivity type forms a depletion layer between each layer and each of the semiconductor layers 10 and 30 of the second conductivity type. In the structure illustrated in FIG. 2, it is assumed that a distance a is given between an edge of the depletion layer extending from the semiconductor layer 40 of the first conductivity type to the semiconductor layer 30 of the second conductivity type and the surface (that is, the upper surface of the uppermost semiconductor layer 40 of the first conductivity type), a distance b is given between an edge of the depletion layer extending from the semiconductor layer 20 of the first conductivity type to the semiconductor layer 30 of the second conductivity type and the surface, and a distance c is given between an edge of the depletion layer extending from the semiconductor layer 20 of the first conductivity type to the semiconductor layer 10 of the second conductivity type and the surface.

A spectral characteristic of the photoelectric current obtained by the semiconductor layer 40 of the first conductivity type and output from the current output terminal 60 is influenced by the distance a indicated in FIG. 2. Likewise, a spectral characteristic of the photoelectric current obtained by the semiconductor layer 20 of the first conductivity type and output from the current output terminal 70 is influenced by the distances b and c indicated in FIG. 2. Here, it should be noted that the spectral characteristic is a characteristic which indicates that sensitivity is given for light of which band of wavelength.

Since the distances a, b and c respectively indicated in FIG. 2 are influenced by the fluctuation caused by process, the spectral characteristic of the photoelectric current output from each of the current output terminals 60 and 70 are influenced by the fluctuation caused by process. For example, in FIG. 2, when the impurity concentration of the semiconductor layer 30 of the second conductivity type becomes high or the depth-direction impurity concentration profile of the semiconductor layer 30 of the second conductivity type becomes broad, the distance a in FIG. 2 becomes small and the distance b in FIG. 2 becomes large, whereby the spectral characteristics of the photoelectric currents respectively output from the current output terminals 60 and 70 are influenced. More specifically, since the incident light in the photoelectric converting apparatus penetrates or enters deeply as the wavelength thereof becomes long, the spectral characteristic of the photoelectric current output from the current output terminal 60 is shifted to the short wavelength side when the distance a becomes small. On the other hand, the spectral characteristic of the photoelectric current output from the current output terminal 70 is shifted to the long wavelength side when the distance b becomes large.

In such a case, the potential to be supplied from the potential supplying unit 50 to the semiconductor layer 30 of the second conductivity type is increased. Thus, since the potential of the semiconductor layer 30 of the second conductivity type is increased, extension of the depletion layer from the semiconductor layer 40 of the first conductivity type to the semiconductor layer 30 of the second conductivity type can be increased, and further the extension of the depletion layer from the semiconductor layer 20 of the first conductivity type to the semiconductor layer 30 of the second conductivity type can be increased. In other words, it is possible to compensate the change occurred due to the fluctuation caused by process, by enlarging the distance a and lessening the distance b.

As described above, in the present embodiment, the potential of the semiconductor layer 10 of the second conductivity type is set by the potential supplying unit 80, and the potential of the semiconductor layer 30 of the second conductivity type is set by the potential supplying unit 50 which is different from the potential supplying unit 80. That is, since the potential of the semiconductor layer 30 of the second conductivity type can be controlled independently of the potential of the semiconductor layer of the second conductivity type, it is possible to change the distances a and b without changing the distance c. On the other hand, it is possible to control the distance c between the edge of the depletion layer extending from the semiconductor layer 20 of the first conductivity type to the semiconductor layer 10 of the second conductivity type and the surface to have a predetermined value independently of the distances a and b, by setting the potential of the semiconductor layer 10 of the second conductivity type according to need. Consequently, it is possible to reduce the influence of the fluctuation caused by process to a color separation characteristic. Incidentally, it should be noted that the color separation characteristic is a characteristic which indicates, when there is a photosensor for a plurality of colors, relation to be obtained when spectral characteristics of the respective colors are combined.

Figure 3:
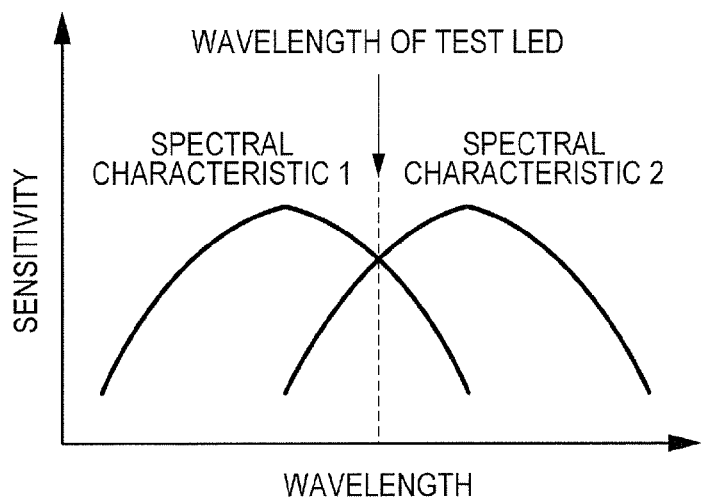
FIG. 3 is a diagram for describing the photoelectric converting apparatus according to the first embodiment of the present invention.

As indicated by FIG. 3, for example, if a wavelength of a test LED (light-emitting diode) is set to the region where two spectral characteristics overlap each other and a range of an output ratio of the two spectral characteristics at the time when light of the LED is irradiated is observed, the color separation characteristic can be easily tested. Then, it is possible to reduce the influence of the fluctuation caused by process to the color separation characteristic, by properly setting, based on a result of the test, the potential to be supplied from the potential supplying units 50 and 80 so that the output ratio falls within a certain range.

Incidentally, in the present embodiment, the four semiconductor layers 10 to 40 are arranged so as to be in contact with others. However, an additional semiconductor layer or a plurality of additional semiconductor layers may be arranged between the adjacent semiconductor layers. For example, a semiconductor layer of which the impurity concentration is different from those of the adjacent semiconductor layers of the same conductivity type may be arranged between these adjacent semiconductor layers so as to adjust the length of the depletion layer. Besides, as in a later-described embodiment, the number of semiconductor layers to be laminated alternately may be set to five or more.

Further, in the present embodiment, the potential is supplied from the potential supplying units 50 and 80 when the signals are output from the semiconductor layers 20 and 40 of the first conductivity type. However, the potential may be supplied from the potential supplying units 50 and 80 when the signal charges generated by the photoelectric conversion are accumulated on the semiconductor layers 20 and 40 of the first conductivity type.

According to the present embodiment, the semiconductor layer 30 of the second conductivity type is separated from the lowermost semiconductor layer 10 of the second conductivity type, and the potential is supplied from the potential supplying unit 50 to the semiconductor layer 30 of the second conductivity type independently of the semiconductor layer 10 of the second conductivity type. Consequently, the potential of the semiconductor layer 10 of the second conductivity type and the potential of the semiconductor layer 30 of the second conductivity type can be controlled independently of each other, it is possible to reduce the influence of the fluctuation caused by process to the color separation characteristic.

Second Embodiment

Subsequently, the second embodiment of the present invention will be described. Here, it should be noted that the constitution of a photoelectric converting apparatus according to the second embodiment is approximately the same as that of the photoelectric converting apparatus according to the first embodiment as illustrated in FIG. 1. Therefore, only a point different from the above first embodiment will be described hereinafter.

In the photoelectric converting apparatus illustrated in FIG. 1, when the lowermost semiconductor layer 10 of the second conductivity type is an N-well layer or an N-type substrate, the potential thereof is often set to power supply potential. Since the semiconductor layer 30 of the second conductivity type is electrically separated from the lowermost semiconductor layer 10 of the second conductivity type, the potential equal to or higher than the power supply potential can be supplied from the potential supplying unit 50 to the semiconductor layer 30 of the second conductivity type. Thus, it is possible to increase a potential barrier between the semiconductor layers 10 and 30 of the second conductivity type by setting the potential of the semiconductor layer 30 of the second conductivity type to be equal to or higher than the power supply potential, whereby it is possible to reduce color mixture.

According to the second embodiment, it is possible to reduce the color mixture by separating the semiconductor layer 30 of the second conductivity type from the lowermost semiconductor layer 10 of the second conductivity type and supplying the potential higher than that of the semiconductor layer 10 of the second conductivity type to the semiconductor layer 30 of the second conductivity type. Incidentally, contrary to the above-described operations, when the first conductivity type is the N type and the second conductivity type is the P type, it is possible to reduce the color mixture by supplying the potential lower than that of the lowermost semiconductor layer 10 of the second conductivity type to the semiconductor layer 30 of the second conductivity type.

According to the embodiment, it is possible to control the potential to be supplied to the second semiconductor layer and the potential to be supplied to the fourth semiconductor layer independently of each other by electrically separating the second semiconductor layer and the fourth semiconductor layer from each other. Thus, it is possible to reduce the influence of the fluctuation caused by process to the color separation characteristic.

Third Embodiment

Figure 4:
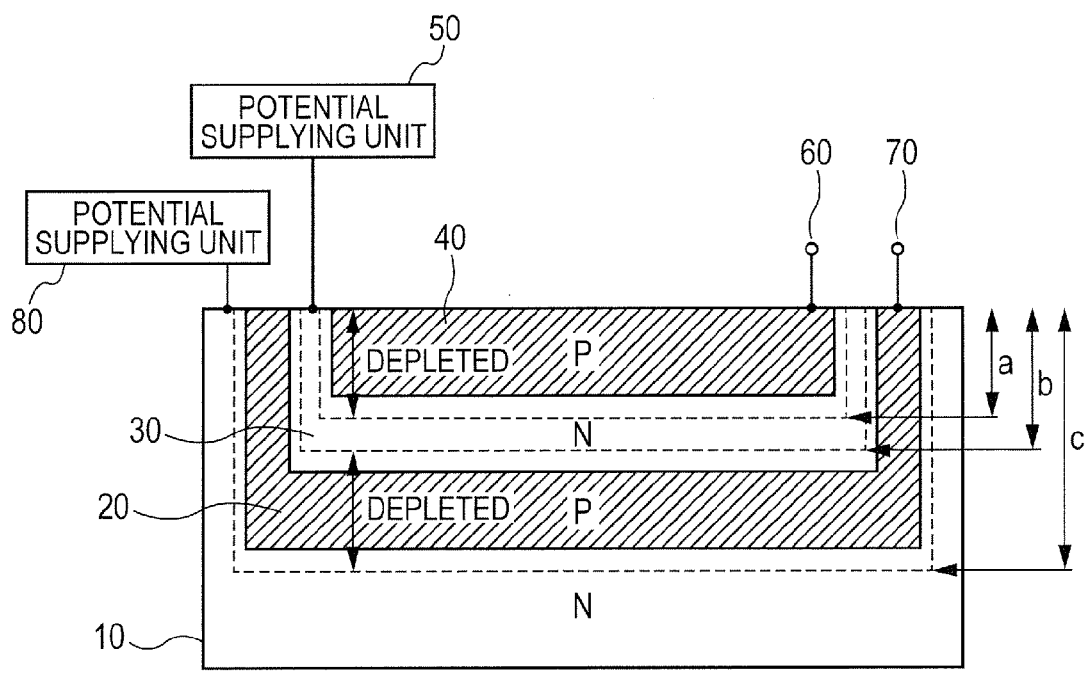
FIG. 4 is a cross-section diagram illustrating a structural example of a photoelectric converting apparatus according to a third embodiment of the present invention.

Subsequently, the third embodiment of the present invention will be described. FIG. 4 is a cross-section diagram illustrating a structural example of a photoelectric converting apparatus according to the third embodiment of the present invention. In the present embodiment, only a point different from the above second embodiment will be described hereinafter.

In the photoelectric converting apparatus illustrated in FIG. 4, each of semiconductor layers 20 and 40 of the first conductivity type is depleted, whereby parasitic capacitance to be added to each of current output terminals 60 and 70 is reduced. As just described, to deplete the semiconductor layer 40 of the first conductivity type, the thickness of the semiconductor layer 40 of the first conductivity type is limited to be equal to or smaller than the width of the depletion layer extending from a semiconductor layer 30 of the second conductivity type. However, it is possible to enlarge the width of the depletion layer extending from the semiconductor layer 30 of the second conductivity type to the semiconductor layer 40 of the first conductivity type by setting potential to be supplied from a potential supplying unit 50 to the semiconductor layer 30 of the second conductivity type high. Therefore, it is possible to design the depth-direction thickness of the semiconductor layer 40 of the first conductivity type large by appropriately controlling the potential of the semiconductor layer 30 of the second conductivity type. Thus, it is possible to improve sensitivity by collecting photocarriers generated in a wide range in the depth direction. This is also applied to the semiconductor layer 20 of the first conductivity type.

According to the third embodiment, the semiconductor layer 30 of the second conductivity type is separated from a lowermost semiconductor layer 10 of the second conductivity type, and the high potential by which the width of the depletion layer extending from the semiconductor layer 30 of the second conductivity type does not come to be equal to or smaller than the width of the semiconductor layer of the first conductivity type is supplied to the semiconductor layer 30 of the second conductivity type, whereby it is possible to improve sensitivity. Incidentally, contrary to the above-described operations, when the first conductivity type is the N type and the second conductivity type is the P type, the low potential by which the width of the depletion layer extending from the semiconductor layer 30 of the second conductivity type does not come to be equal to or smaller than the width of the semiconductor layer of the first conductivity type maybe supplied to the semiconductor layer 30 of the second conductivity type.

According to the embodiment, it is possible to control the potential to be supplied to the second semiconductor layer and the potential to be supplied to the fourth semiconductor layer independently of each other by electrically separating the second semiconductor layer and the fourth semiconductor layer from each other. Thus, it is possible to reduce the influence of the fluctuation caused by process to the color separation characteristic.

Fourth Embodiment

Figure 5:
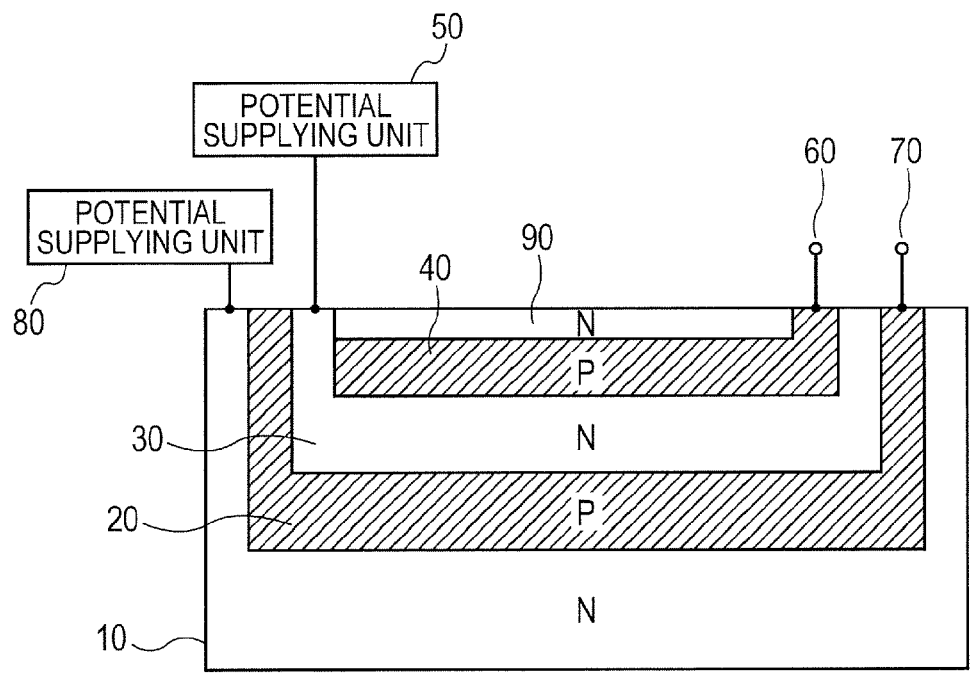
FIG. 5 is a cross-section diagram illustrating a structural example of a photoelectric converting apparatus according to a fourth embodiment of the present invention.
Figure 6:
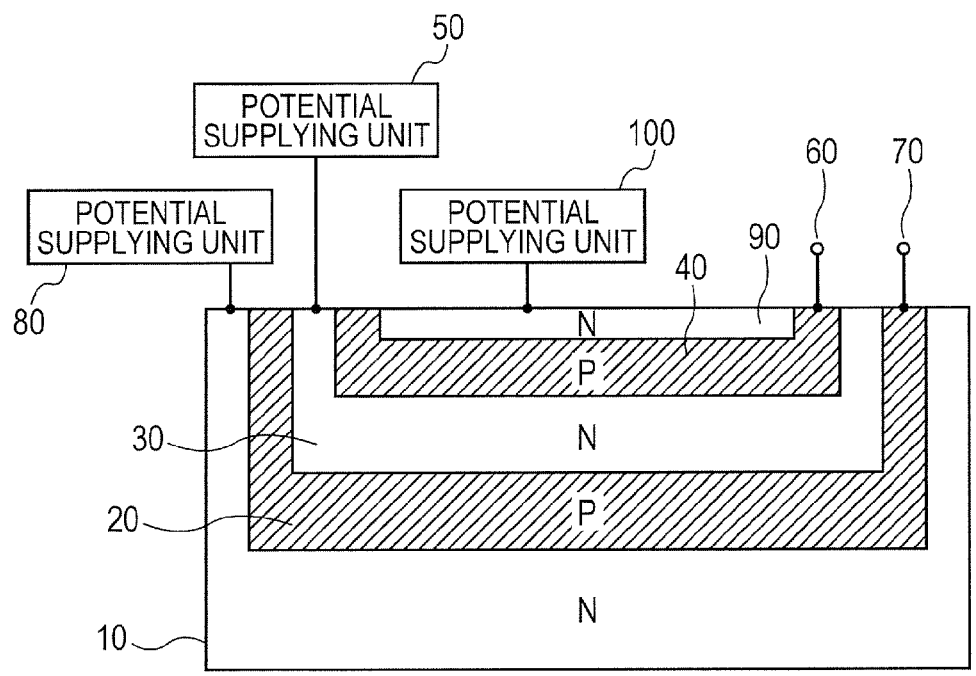
FIG. 6 is a cross-section diagram illustrating the structural example of the photoelectric converting apparatus according to the fourth embodiment of the present invention.

Subsequently, the fourth embodiment of the present invention will be described. FIGS. 5 and 6 are cross-section diagrams illustrating a structural example of a photoelectric converting apparatus according to the fourth embodiment. In the present embodiment, only a point different from the above first embodiment will be described hereinafter.

In the photoelectric converting apparatus according to the fourth embodiment as illustrated in FIG. 5, a semiconductor layer (fifth semiconductor layer) 90 of the second conductivity type is formed on a semiconductor layer 40 of the first conductivity type. As just described, it is possible to reduce a dark current component occurred at the interface between the semiconductor and an insulating film (not illustrated), by adding the semiconductor layer 90 of the second conductivity type to the uppermost surface.

Further, in the photoelectric converting apparatus as illustrated in FIG. 6, the semiconductor layer 90 of the second conductivity type is separated from a semiconductor layer 30 of the second conductivity type, and a potential supplying unit 100 is provided to be connected to the semiconductor layer 90 of the second conductivity type. The potential supplying unit 100 can independently set the potential of the semiconductor layer 90 of the second conductivity type. Thus, a potential supplying unit 50 can be used to correct a color separation characteristic, while the potential to be supplied from the potential supplying unit 50 to the semiconductor layer 90 of the second conductivity type can be set to the potential optimized for reducing the dark current component.

According to the fourth embodiment, it is possible to reduce the dark current component by adding the semiconductor layer 90 of the second conductivity type to the uppermost surface on the semiconductor layer 40 of the first conductivity type.

According to the embodiment, it is possible to control the potential to be supplied to the second semiconductor layer and the potential to be supplied to the fourth semiconductor layer independently of each other by electrically separating the second semiconductor layer and the fourth semiconductor layer from each other. Thus, it is possible to reduce the influence of the fluctuation caused by process to the color separation characteristic.

Fifth Embodiment

Figure 7:
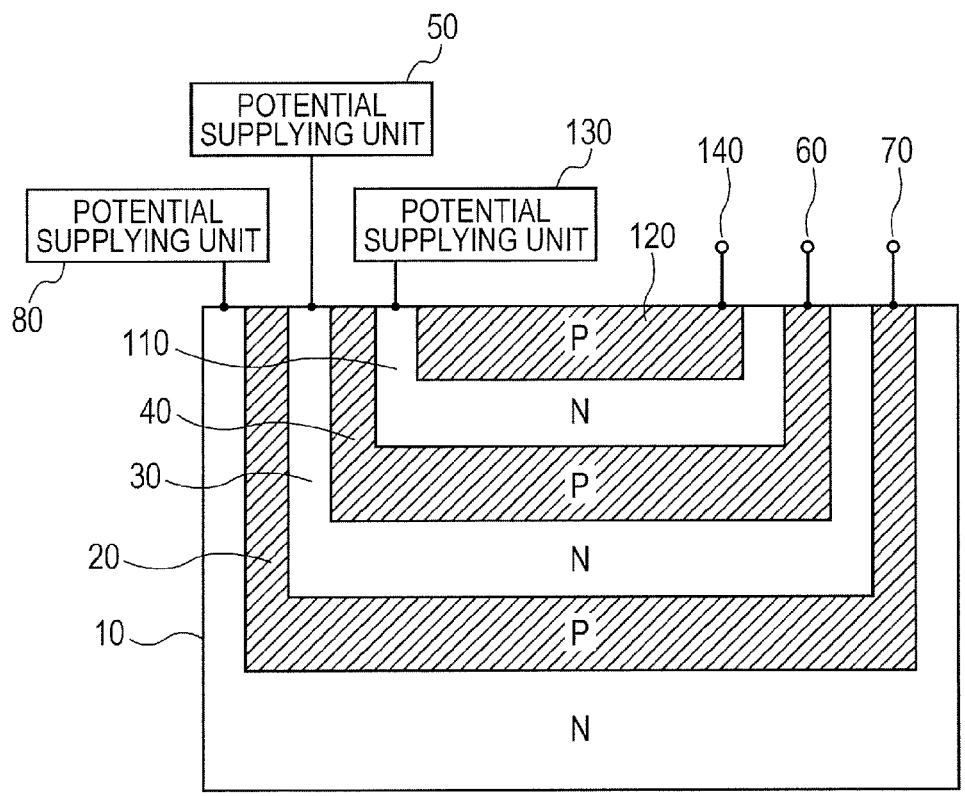
FIG. 7 is a cross-section diagram illustrating a structural example of a photoelectric converting apparatus according to a fifth embodiment of the present invention.

Subsequently, the fifth embodiment of the present invention will be described. FIG. 7 is a cross-section diagram illustrating a structural example of a photoelectric converting apparatus according to the fifth embodiment. In the present embodiment, only a point different from the above first embodiment will be described hereinafter.

In the photoelectric converting apparatus according to the fifth embodiment as illustrated in FIG. 7, a semiconductor layer 110 of the second conductivity type is formed on a semiconductor layer 40 of the first conductivity type, and a semiconductor layer 120 of the first conductivity type is formed on the semiconductor layer 110 of the second conductivity type. Further, a potential supplying unit 130 is connected to the semiconductor layer 110 of the second conductivity type, and a current output terminal 140 is provided on the semiconductor layer 120 of the first conductivity type. The potential supplying unit 130 can independently set potential of the semiconductor layer 110 of the second conductivity type. That is, in the photoelectric converting apparatus according to the fifth embodiment, potential supplying units 50, 80 and 130 can independently set potential of corresponding semiconductor layers 30, 10 and 110 of the second conductivity type, respectively.

Figure 8:
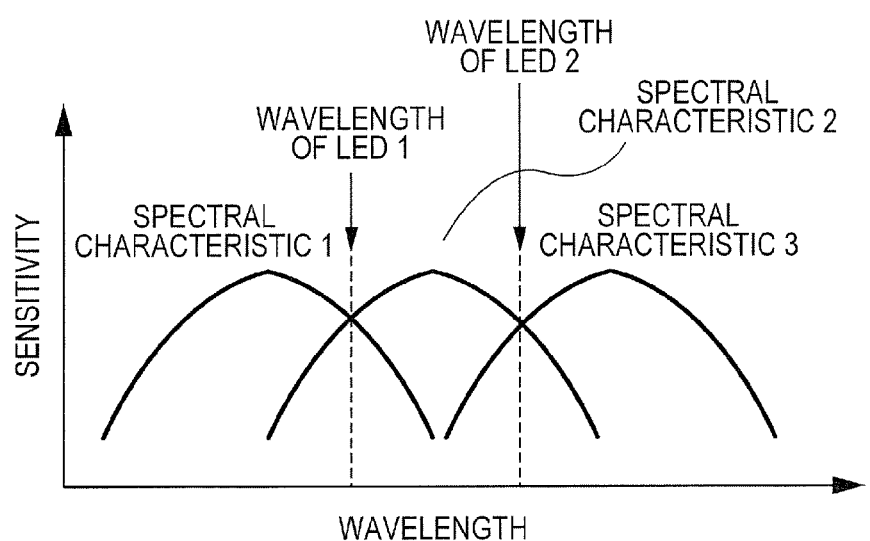
FIG. 8 is a diagram for describing the photoelectric converting apparatus according to the fifth embodiment of the present invention.

In the photoelectric converting apparatus illustrated in FIG. 7, it is possible to obtain three color signals respectively having different spectral characteristics from current output terminals 60, 70 and 140, whereby it is possible to obtain spectral characteristics as exemplarily illustrated in FIG. 8. In the photoelectric converting apparatus illustrated in FIG. 7, it is possible to adjust a color separation characteristic of spectral characteristics 1 and 2 illustrated in FIG. 8 and a color separation characteristic of spectral characteristics 2 and 3 independently by independently adjusting the potential of the potential supplying units 50, 80 and 130.

According to the fifth embodiment, it is possible to independently adjust the potential of the semiconductor layers 30, 10 and 110 of the second conductivity type by independently adjusting the potential supplied from the potential supplying units 50, 80 and 130. Therefore, it is possible to more accurately reduce an influence of a fluctuation caused by process to the spectral characteristic.

Incidentally, in the fifth embodiment, arbitrary two of the semiconductor layers 10, 30 and 110 of the second conductivity type may be connected mutually and the potential of these semiconductor layers may be set in common. However, even in such a case, at least one of the semiconductor layers 10, 30 and 110 of the second conductivity type is electrically separated from the remaining two semiconductor layers, and the potential is independently set to the separated semiconductor layer.

According to the embodiment, it is possible to control the potential to be supplied to the second semiconductor layer and the potential to be supplied to the fourth semiconductor layer independently of each other by electrically separating the second semiconductor layer and the fourth semiconductor layer from each other. Thus, it is possible to reduce the influence of the fluctuation caused by process to the color separation characteristic.

Sixth Embodiment

Figure 9:
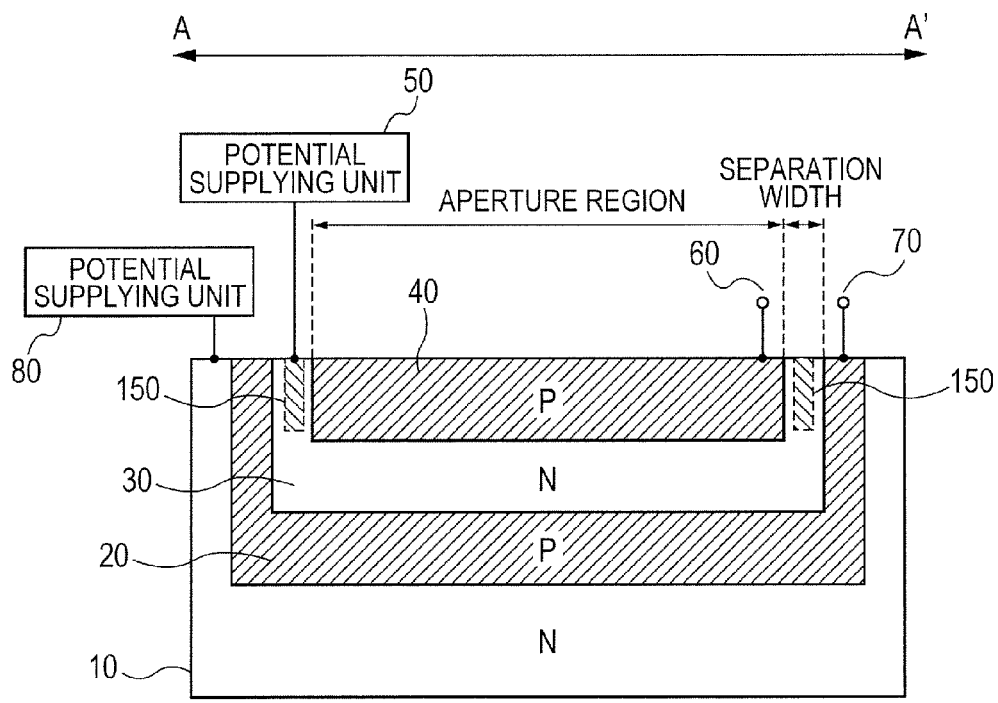
FIG. 9 is a cross-section diagram illustrating a structural example of a photoelectric converting apparatus according to a sixth embodiment of the present invention.
Figure 10:
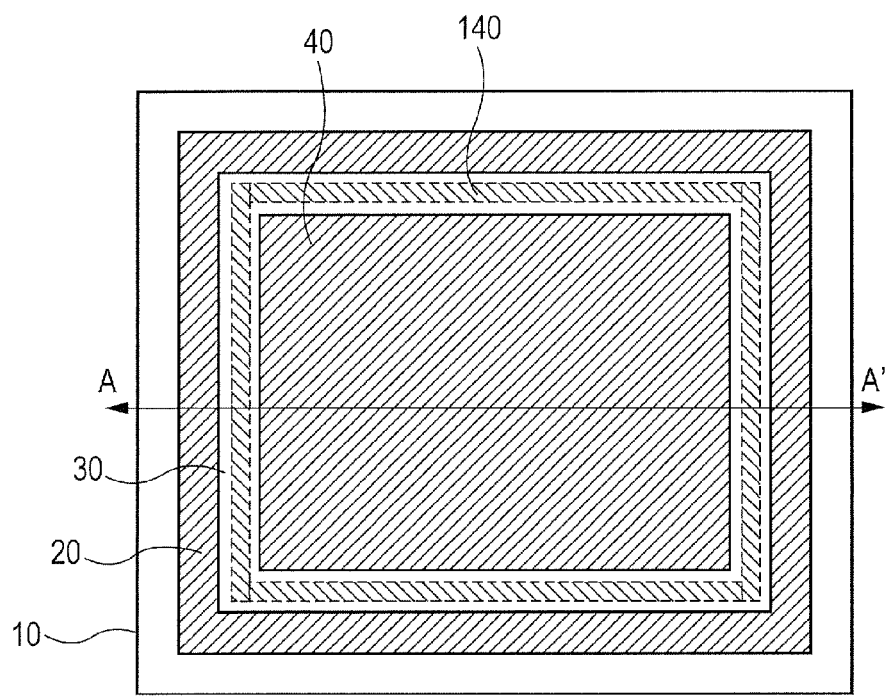
FIG. 10 is a two-dimensional diagram illustrating the structural example of the photoelectric converting apparatus according to the sixth embodiment of the present invention.

Subsequently, the sixth embodiment of the present invention will be described. FIG. 9 is a cross-section diagram illustrating a structural example of a photoelectric converting apparatus according to the sixth embodiment, and FIG. 10 is a two-dimensional diagram illustrating the structural example of the photoelectric converting apparatus illustrated in FIG. 9. In these drawings, the A-A' portion of FIG. 10 corresponds to the cross-section of the photoelectric converting apparatus illustrated in FIG. 9. In the present embodiment, only a point different from the above first embodiment will be described hereinafter.

In the photoelectric converting apparatus according to the sixth embodiment, as illustrated in FIGS. 9 and 10, the surface portion of a semiconductor layer 30 of the second conductivity type is provided between semiconductor layers 20 and 40 of the first conductivity type, and this portion is made by an impurity region 150 of the second conductivity type of which the concentration is higher than that of the remaining portion of the semiconductor layer 30 of the second conductivity type. Here, "separation width" in FIG. 9 indicates a planar-direction distance of the surface portion between the semiconductor layers 20 and 40 of the first conductivity type. Further, "aperture region" in FIG. 9 indicates an overlapping region of the semiconductor layers 20 and 40 of the first conductivity type, and an appropriate spectral characteristic can be obtained in the overlapping region when light is irradiated.

According to the sixth embodiment, since the high-concentration impurity region 150 of the second conductivity type is provided between the semiconductor layers 20 and 40 of the first conductivity type, a short circuit between the semiconductor layers 20 and 40 of the first conductivity type is hard to occur (that is, electrical connection between these layers is hard to occur) even if the separation width is further shorten. For this reason, the aperture region illustrated in FIG. 9 can be widened, whereby it is possible to improve sensitivity.

According to the embodiment, it is possible to control the potential to be supplied to the second semiconductor layer and the potential to be supplied to the fourth semiconductor layer independently of each other by electrically separating the second semiconductor layer and the fourth semiconductor layer from each other. Thus, it is possible to reduce the influence of the fluctuation caused by process to the color separation characteristic.

Seventh Embodiment

Figure 11:
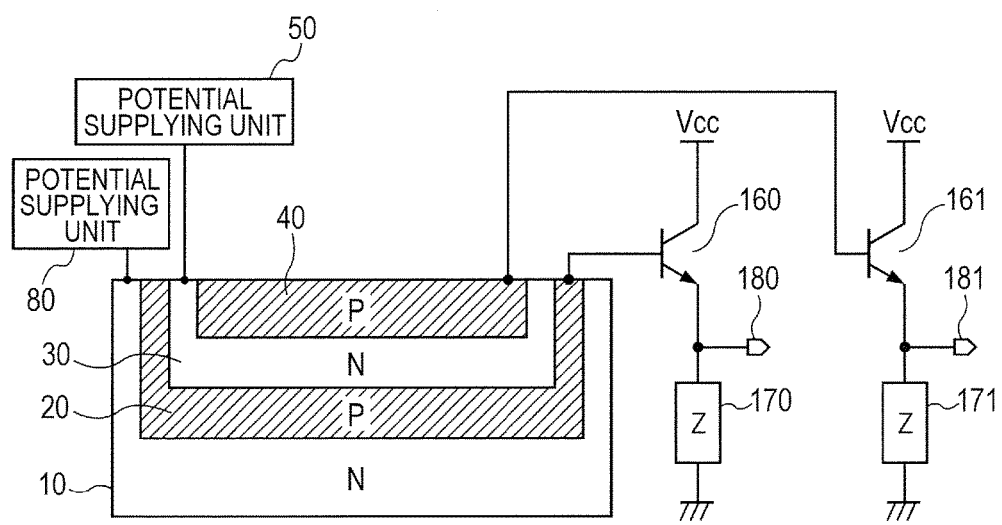
FIG. 11 is a cross-section diagram illustrating a structural example of a photoelectric converting apparatus according to a seventh embodiment of the present invention.

Subsequently, the seventh embodiment of the present invention will be described. FIG. 11 is a cross-section diagram illustrating a structural example of a photoelectric converting apparatus according to the seventh embodiment. In the present embodiment, only a point different from the above second embodiment will be described hereinafter.

In the present embodiment, the base of a bipolar transistor 160 is connected to a semiconductor layer 20 of the first conductivity type, and the base of a bipolar transistor 161 is connected to a semiconductor layer 40 of the first conductivity type. Further, a load 170 and an output terminal 180 are connected to the emitter of the bipolar transistor 160, and a load 171 and an output terminal 181 are connected to the emitter of the bipolar transistor 161. Furthermore, the collectors of the bipolar transistors 160 and 161 are respectively connected to the node of a power supply voltage Vcc.

In the photoelectric converting apparatus according to the seventh embodiment, photoelectric currents respectively obtained from the semiconductor layers 20 and 40 of the first conductivity type are input to the bases of the respective bipolar transistors 160 and 161, and then the amplified photoelectric currents are output from the emitters of the respective transistors. Further, the output currents are subjected to voltage conversion by the respective loads 170 and 171, and the obtained currents are output from the respective output terminals 180 and 181.

Here, the potential of the semiconductor layer 30 of the second conductivity type is set by a potential supplying unit 50 to be higher than the potential (e.g., power supply potential) of a lowermost semiconductor layer 10 of the second conductivity type. Thus, it is possible to prevent that the semiconductor layers 20 and 40 of the first conductivity type are electrically connected to each other, even if the base potential of the bipolar transistors 160 and 161 more increases. For this reason, since operable ranges of the base potential and the emitter potential of the bipolar transistors 160 and 161 are widened, it is possible to widen a dynamic range of a circuit.

According to the seventh embodiment, since a semiconductor layer 30 of the second conductivity type is separated from the lowermost semiconductor layer 10 of the second conductivity type and the potential higher than that of the semiconductor layer 10 of the second conductivity type is supplied to the semiconductor layer 30 of the second conductivity type, it is possible to widen the dynamic range of the circuit.

According to the embodiment, it is possible to control the potential to be supplied to the second semiconductor layer and the potential to be supplied to the fourth semiconductor layer independently of each other by electrically separating the second semiconductor layer and the fourth semiconductor layer from each other. Thus, it is possible to reduce the influence of the fluctuation caused by process to the color separation characteristic.

Eighth Embodiment

Figure 12:
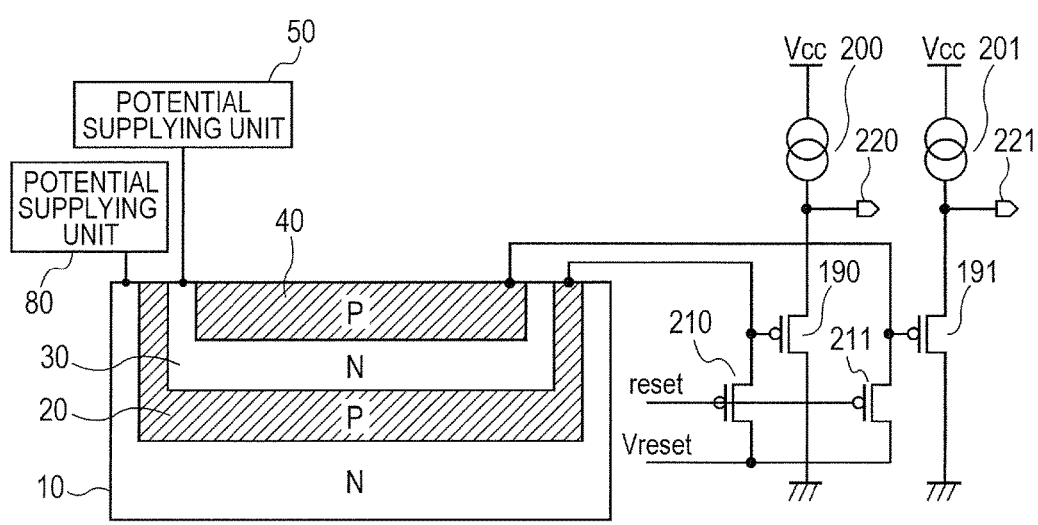
FIG. 12 is a cross-section diagram illustrating a structural example of a photoelectric converting apparatus according to an eighth embodiment of the present invention.

Subsequently, the eighth embodiment of the present invention will be described. FIG. 12 is a cross-section diagram illustrating a structural example of a photoelectric converting apparatus according to the eighth embodiment. In the present embodiment, only a point different from the above second embodiment will be described hereinafter.

In the present embodiment, each of MOSFETS (metal-oxide semiconductor field-effect transistors) 190, 191, 210 and 211 is a P-type transistor. The gate of the MOSFET 190 and the source of the MOSFET 210 are both connected to a semiconductor layer 20 of the first conductivity type, and the gate of the MOSFET 191 and the source of the MOSFET 211 are both connected to a semiconductor layer 40 of the first conductivity type. Further, a current source 200 and an output terminal 220 are both connected to the source of the MOSFET 190, and a current source 201 and an output terminal 221 are both connected to the source of the MOSFET 191. The MOSFETS 190 and 191 respectively constitute source followers together with the current sources 200 and 201. A reset signal reset is supplied to the gates of both the MOSFETS 210 and 211, and the drains of the MOSFETS 210 and 211 are both connected to the node of reset potential Vreset.

In the photoelectric converting apparatus according to the eighth embodiment, the MOSFETS 210 and 211 are first turned on (establishing a conduction state) to initialize the potential of the semiconductor layers 20 and 40 of the first conductivity type to reset potential. After then, the MOSFETS 210 and 211 are turned off (establishing a non-conduction state) to perform voltage conversion to signal charges obtained by photoelectric conversion from the semiconductor layers 20 and 40 of the first conductivity type by the capacitance attached to the gate terminals of the MOSFETS 190 and 191. Subsequently, the obtained signal voltages are read out from the output terminals 220 and 221.

Here, the potential of a semiconductor layer 30 of the second conductivity type is set by a potential supplying unit 50 to be higher than the potential (e.g., power supply potential) of a lowermost semiconductor layer 10 of the second conductivity type. Thus, it is possible to prevent that the semiconductor layers 20 and 40 of the first conductivity type are electrically connected to each other, even if the gate potential of the MOSFETS 190 and 191 more increases. For this reason, it is possible to widen a dynamic range of a circuit.

According to the eighth embodiment, since the semiconductor layer 30 of the second conductivity type is separated from the lowermost semiconductor layer 10 of the second conductivity type and the potential higher than that of the semiconductor layer 10 of the second conductivity type is supplied to the semiconductor layer 30 of the second conductivity type, it is possible to widen the dynamic range of the circuit.

According to the embodiment, it is possible to control the potential to be supplied to the second semiconductor layer and the potential to be supplied to the fourth semiconductor layer independently of each other by electrically separating the second semiconductor layer and the fourth semiconductor layer from each other. Thus, it is possible to reduce the influence of the fluctuation caused by process to the color separation characteristic.

Other Embodiments

In the above-described first to eighth embodiments, it has been assumed that the first conductivity type is the P type and the second conductivity type is the N type. However, it may be assumed that the first conductivity type is the N type and the second conductivity type is the P type. Further, in the above-described first to eighth embodiments, the number of the semiconductor layers of the first conductivity type has been exemplarily set to "two" or "three". However, the present invention is not limited to this, and the number of the semiconductor layers of the first conductivity type may arbitrarily set (only "plural number"). Furthermore, an embodiment obtained by properly combining the above-described first to eighth embodiments is included in the embodiments of the present invention.

Aspects of the present invention can also be realized by a computer of a system or an apparatus (or devices such as a CPU or an MPU) that reads out and executes a program recorded on a memory device to perform the functions of the above-described embodiments, and by a method, the steps of which are performed by a computer of a system or an apparatus by, for example, reading out and executing a program recorded on a memory device to perform the functions of the above-described embodiments. For this purpose, the program is provided to the computer for example via a network or from a recording medium of various types serving as the memory device (e.g., a computer-readable medium).

While the present invention has been described with reference to the exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-193057, filed Sep. 5, 2011, which is hereby incorporated by reference herein in its entirety.

What is claimed is:

1. A photoelectric converting apparatus comprising:
a first potential supplying unit to supply a first potential;
a second potential supplying unit to supply a second potential, the value of the second potential being independent of the value of the first potential;
a first current output terminal;
a second current output terminal;
a first semiconductor layer of a first conductivity type, connected to said first current output terminals, and configured to output a first signal obtained by photoelectric conversion;
a second semiconductor layer of a second conductivity type opposite to said first conductivity type from which a current signal is not output, and configured to be supplied with a first potential from said first potential supplying unit and connected to said first potential supplying unit;
a third semiconductor layer of said first conductivity type, connected to said second current output terminals, and configured to output a second signal obtained by photoelectric conversion;
a fourth semiconductor layer of said second conductivity type from which a current signal is not output, and configured to be supplied with a second potential from said second potential supplying unit and connected to said second potential supplying unit;
wherein said first semiconductor layer, said second semiconductor layer, said third semiconductor layer and said fourth semiconductor layer are arranged in sequence,
wherein said second semiconductor layer and said fourth semiconductor layer are electrically separated from each other, and
wherein the first potential to be supplied to said second semiconductor layer and the second potential to be supplied to said fourth semiconductor layer are to be controlled independently from each other.

2. The photoelectric converting apparatus according to claim 1, further comprising a third potential supplying unit and a fifth semiconductor layer of said second conductivity type,
wherein said fifth semiconductor layer is electrically separated respectively from said second semiconductor layer and said fourth semiconductor layer, and
a third potential to be supplied from said third potential supplying unit to said fifth semiconductor layer is to be independently controlled.

3. The photoelectric converting apparatus according to claim 1, further comprising a fifth semiconductor layer of said second conductivity type, arranged on a surface side of said first semiconductor layer,
wherein said fifth semiconductor layer and said second semiconductor layer are electrically connected to each other.

4. The photoelectric converting apparatus according to claim 1, wherein said second conductivity type is an N type, and the first potential to be supplied to said second semiconductor layer is higher than the second potential to be supplied to said fourth semiconductor layer.

5. The photoelectric converting apparatus according to claim 1, wherein said second conductivity type is a P type, and the first potential to be supplied to said second semiconductor layer is lower than the second potential to be supplied to said fourth semiconductor layer.

6. The photoelectric converting apparatus according to claim 1, wherein at least one of said first semiconductor layer and said third semiconductor layer is depleted.

7. The photoelectric converting apparatus according to claim 1, wherein an uppermost semiconductor layer is a semiconductor layer of said second conductivity type.

8. The photoelectric converting apparatus according to claim 7, wherein said uppermost semiconductor layer is electrically separated from at least one of said second semiconductor layer or said fourth semiconductor layer, and a third potential to be supplied to said uppermost semiconductor layer is to be controlled independently of at least one of said second semiconductor layer or said fourth semiconductor layer.

9. The photoelectric converting apparatus according to claim 1, wherein an impurity concentration of said second conductivity type of a first portion of said second semiconductor layer, said first portion arranged on a surface of said second semiconductor layer, is higher than that of a second portion of said second semiconductor layer different from said first portion.

10. The photoelectric converting apparatus according to claim 1, wherein an impurity concentration of a first portion of said second semiconductor layer, said first portion connected to said first potential supplying unit, is higher than an impurity concentration of a second portion of said second semiconductor layer different from said first portion.

11. The photoelectric converting apparatus according to claim 1, further comprising a bipolar transistor, wherein a base of said bipolar transistor is connected to at least one of said first semiconductor layer or said third semiconductor layer, and said bipolar transistor is configured to output an amplified photoelectric current from an emitter of said bipolar transistor.

12. The photoelectric converting apparatus according to claim 1, further comprising a field-effect transistor, wherein a gate of said field-effect transistor is connected to at least one of said first semiconductor layer or said third semiconductor layer, and said field-effect transistor is configured to read out a signal charge obtained by photoelectric conversion via a conversion from the signal charge into an voltage signal.

13. The photoelectric converting apparatus according to claim 1, wherein said first potential supplying unit supplies the first potential to said second semiconductor layer and said second potential supplying unit supplies the second potential to said fourth semiconductor layer when the first signal and the second signal are output respectively from said first semiconductor layer and said third semiconductor layer.

14. The photoelectric converting apparatus according to claim 1, wherein said first potential supplying unit is configured to supply the first potential to said second semiconductor layer and said second potential supplying unit is configured to supply the second potential to said fourth semiconductor layer when signal charges generated by photoelectric conversion are accumulated in said first semiconductor layer and said third semiconductor layer.

15. The photoelectric converting apparatus according to claim 1, wherein said second semiconductor layer is directly connected to a first wiring of said first potential supplying unit, and said fourth semiconductor layer is directly connected to a second wiring of said second potential supplying unit.

16. The photoelectric converting apparatus according to claim 1, wherein the first potential and the second potential are to be set so as to control spectral characteristics of photoelectric currents obtained by said second semiconductor layer and said fourth semiconductor layer, respectively.

17. A photoelectric converting apparatus comprising:
a first potential supplying unit to supply a first potential;
a second potential supplying unit to supply a second potential, a value of the second potential being independent of a value of the first potential;
a first current output terminal;
a second current output terminal;
a first semiconductor layer of a first conductivity type, connected to said first current output terminal, and configured to output a first signal obtained by photoelectric conversion;
a second semiconductor layer of a second conductivity type opposite to said first conductivity type from which a current signal is not output, and configured to be supplied with a first potential from said first potential supplying unit;
a third semiconductor layer of said first conductivity type, connected to said second current output terminal, and configured to output a second signal obtained by photoelectric conversion;
a fourth semiconductor layer of said second conductivity type from which a current signal is not output, and configured to be supplied with a second potential from said second potential supplying unit,
wherein said first semiconductor layer, said second semiconductor layer, said third semiconductor layer and said fourth semiconductor layer are arranged in sequence,
said second semiconductor layer and said fourth semiconductor layer are electrically separated from each other,
the first potential to be supplied to said second semiconductor layer and the second potential to be supplied to said fourth semiconductor layer are to be controlled independently from each other,
a fifth semiconductor layer of said second conductivity type is arranged on a surface side of said first semiconductor layer,
both said first semiconductor layer and said third semiconductor layer are configured to be depleted, and
an impurity concentration of a first portion of said second semiconductor layer, said first portion connected to said first potential supplying unit, is higher than an impurity concentration of a second portion different from said first portion of said second semiconductor layer.

18. The photoelectric converting apparatus according to claim 17, wherein
said first potential supplying unit is configured to supply the first potential to said second semiconductor layer and said second potential supplying unit is configured to supply the second potential to said fourth semiconductor layer when the first signal and the second signal are output respectively from said first semiconductor layer and said third semiconductor layer, and
a base of a bipolar transistor is connected to at least one of said first semiconductor layer or said third semiconductor layer, and said bipolar transistor is configured to output an amplified photoelectric current from an emitter of said bipolar transistor.

19. The photoelectric converting apparatus according to claim 17, wherein
said first potential supplying unit is configured to supply the first potential to said second semiconductor layer and said second potential supplying unit is configured to supply the second potential to said fourth semiconductor layer when signal charges generated by the photoelectric conversion are accumulated on said first semiconductor layer and said third semiconductor layer, and a gate of a field-effect transistor is connected to at least one of said first semiconductor layer or said third semiconductor layer, and said field-effect transistor is configured to read out the signal charge obtained by photoelectric conversion via a conversion from the signal charge into a voltage signal.

* * * * *